United States Patent
You

(10) Patent No.: US 7,799,594 B2
(45) Date of Patent: Sep. 21, 2010

(54) THIN FILM TRANSISTOR ARRAY PANEL AND METHOD FOR MANUFACTURING THE SAME

(75) Inventor: Chun-Gi You, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 8 days.

(21) Appl. No.: 12/354,130

(22) Filed: Jan. 15, 2009

(65) Prior Publication Data

US 2010/0051956 A1    Mar. 4, 2010

(30) Foreign Application Priority Data

Sep. 4, 2008   (KR) ................. 10-2008-0087372

(51) Int. Cl.
*H01L 21/00* (2006.01)

(52) U.S. Cl. .................... 438/48; 438/24; 438/46; 438/80; 438/149; 257/E27.001

(58) Field of Classification Search ............ 438/24, 438/46, 48, 80, 149
See application file for complete search history.

(56) References Cited

U.S. PATENT DOCUMENTS

| | | | |
|---|---|---|---|
| 5,756,372 A * | 5/1998 | Wakui et al. | 438/30 |
| 2005/0034810 A1* | 2/2005 | Yamazaki et al. | 156/345.3 |
| 2007/0089761 A1* | 4/2007 | Banerjee et al. | 134/34 |
| 2008/0026325 A1* | 1/2008 | Cornwell et al. | 430/296 |

* cited by examiner

*Primary Examiner*—Wai-Sing Louie
(74) *Attorney, Agent, or Firm*—Cantor Colburn LLP

(57) ABSTRACT

A thin film transistor array panel includes a substrate; a first gate line disposed on the substrate and including a gate electrode; a storage electrode disposed in a layer which is the same layer as a layer of the first gate line; a gate insulating layer disposed on the first gate line and the storage electrode; a semiconductor disposed on the gate insulating layer and including a channel portion; a data line disposed on the semiconductor and including a source electrode; a drain electrode disposed on the semiconductor and facing the source electrode; a passivation layer disposed on the gate insulating layer, the data line, and the drain electrode, the passivation layer including a contact hole which exposes a portion of the drain electrode; and a pixel electrode disposed on the passivation layer and electrically connected to the drain electrode through the contact hole, wherein the gate insulating layer and the passivation layer are interposed between the pixel electrode and the substrate except for a region corresponding to the contact hole, and wherein the pixel electrode overlaps the storage electrode via the gate insulating layer and the passivation layer.

13 Claims, 14 Drawing Sheets

110    126    124    125

IIIB   110  129    IIIB'    IIIB"

THIN FILM TRANSISTOR ARRAY PANEL AND METHOD FOR MANUFACTURING THE SAME

This application claims priority to Korean Patent Application No. 10-2008-0087372, filed on Sep. 4, 2008, and all the benefits accruing therefrom under 35 U.S.C. §119, the contents of which in its entirety are herein incorporated by reference.

BACKGROUND OF THE INVENTION (a) Field of the Invention

This disclosure relates to a thin film transistor array panel and a method for manufacturing the same.

(b) Description of the Related Art

A thin film transistor is used as a switching element to independently drive each pixel in a flat panel display device, such as a liquid crystal display or an organic light-emitting device. The thin film transistor array panel includes a thin film transistor, a scanning signal line (or a gate line) for transmitting a scanning signal to the thin film transistor, and a data line for transmitting a data signal, as well as a pixel electrode electrically connected to the thin film transistor.

To form a thin film transistor array panel, several photolithographic processes are required, and each photolithographic process can include several tens to several hundreds of steps, thus if the number of photolithographic processes is increased, a process time and a cost are increased. Accordingly, various methods to reduce the number of photolithographic processes have been proposed, however there are problems involved with reducing the number of photolithographic processes such that it is difficult to reduce the number thereof.

BRIEF SUMMARY OF THE INVENTION

The above described and other drawbacks are alleviated by a thin film transistor array panel including a substrate; a first gate line disposed on the substrate and including a gate electrode; a storage electrode disposed in a layer which is the same layer as a layer of the first gate line; a gate insulating layer disposed on the first gate line and the storage electrode; a semiconductor disposed on the gate insulating layer and including a channel portion; a data line disposed on the semiconductor and including a source electrode; a drain electrode disposed on the semiconductor and facing the source electrode; a passivation layer disposed on the gate insulating layer, the data line, and the drain electrode, the passivation layer including a contact hole which exposes a portion of the drain electrode; and a pixel electrode disposed on the passivation layer and electrically connected to the drain electrode through the contact hole, wherein the gate insulating layer and the passivation layer are interposed between the pixel electrode and the substrate except for a region corresponding to the contact hole, and wherein the pixel electrode overlaps the storage electrode via the gate insulating layer and the passivation layer.

In an embodiment, the storage electrode may include a portion of a second gate line, which is parallel to the first gate line, and transmits a gate signal.

In an embodiment, the passivation layer may further include a first opening which exposes an end portion of the first gate line, and a second opening, which exposes an end portion of the data line, and wherein the thin film transistor array may further include a first contact assistant disposed in the first opening and electrically connected to the end portion of the first gate line; and a second contact assistant disposed in the second opening and electrically connected to the end portion of the data line.

In an embodiment, the first contact assistant may further contact the substrate surrounding the end portion of the first gate line, and the second contact assistant may further contact the substrate surrounding the end portion of the data line.

In an embodiment, a planar shape of the semiconductor, except for the channel portion, may be the same as a planar shape of the data line and the drain electrode.

In an embodiment, the storage electrode may include a portion of a second gate line, which is parallel to the first gate line and transmits a gate signal.

In an embodiment, the passivation layer may further include a first opening, which exposes an end portion of the first gate line, and a second opening, which exposes an end portion of the data line, and wherein the thin film transistor array panel may further include a first contact assistant disposed in the first opening and electrically connected to the end portion of the first gate line; and a second contact assistant disposed in the second opening and electrically connected to the end portion of the data line.

In an embodiment, the first contact assistant may further contact the substrate surrounding the end portion of the first gate line, and the second contact assistant may further contact the substrate surrounding the end portion of the data line.

In an embodiment, a manufacturing method of a thin film transistor array panel includes disposing a first gate line including a gate electrode and an end portion on a substrate; disposing a gate insulating layer on the first gate line; disposing a semiconductor including a channel portion, a data line including a source electrode and an end portion, and a drain electrode on the gate insulating layer; disposing a passivation layer on the gate insulating layer, the data line, the drain electrode, and the channel portion of the semiconductor; disposing a photosensitive film on the passivation layer and exposing the photosensitive film to light using a first photo mask to form a first photosensitive film pattern, which includes a first portion and a second portion, the second portion having a thickness which is greater than a thickness of the first portion, the first photosensitive film pattern exposing a portion of the passivation layer on a portion of the drain electrode; removing the exposed portion of the passivation layer using the first photosensitive film pattern as a mask; etching the first photosensitive film pattern to remove the first portion to form a second photosensitive film pattern; disposing a conductive layer on the second photosensitive film pattern; heating the second photosensitive film pattern to form cracks in the conductive layer; and forming a pixel electrode by removing the second photosensitive film pattern, the pixel electrode contacting a portion of the drain electrode and disposed on a portion of the passivation layer exposed by the removal of the first portion of the first photosensitive film pattern.

In an embodiment, the first photo mask may include a first transparent region through which where light is transmitted, a first opaque region where light is blocked, and a first translucent region which corresponds to the first portion and through which light is partially transmitted.

In an embodiment, the first translucent region may include at least one of a slit, a lattice pattern, and a translucent film.

In an embodiment, disposing the semiconductor, the data line, and the drain electrode may further include disposing a second photo mask.

In an embodiment, disposing the semiconductor, and the data line and the drain electrode may include disposing sequentially an intrinsic semiconductor layer, an impurity-doped semiconductor layer, and a data conductive layer on the gate insulating layer; disposing a photosensitive film on the data conductive layer and exposing the photosensitive film to light using the second photo mask to form a third photosensitive film pattern, which includes a third portion corresponding to the channel portion of the semiconductor, and a fourth portion, the fourth portion including a thickness which is greater than a thickness of the third portion; removing a portion of the data conductive layer, a portion of the impurity-doped semiconductor layer, and a portion of the semiconductor layer using the third photosensitive film pattern as a mask; etching the third photosensitive film pattern to remove the third portion to form a fourth photosensitive film pattern; and etching the data conductive layer and the impurity-doped semiconductor layer exposed by the removal of the third portion using the fourth photosensitive film pattern as a mask.

In an embodiment, the second photo mask may further include a second transparent region through which light is transmitted, a second opaque region where light is blocked, and a second translucent region through which light is partially transmitted.

In an embodiment, the first photosensitive film pattern may further expose a portion of the passivation layer disposed on the end portion of the first gate line and a portion of passivation layer disposed on the end portion of the data line, and the forming of the pixel electrode may further include disposing first and second contact assistants respectively contacting the end portion of the first gate line and the end portion of the data line.

In an embodiment, removing the portion of the passivation layer may further include etching the gate insulating layer using the first photosensitive film pattern as a mask to expose the end portion of the first gate line.

In an embodiment, etching the gate insulating layer further includes exposing the substrate surrounding the end portion of the first gate line and the substrate surrounding the end portion of the data line.

In an embodiment, disposing the semiconductor, the data line, and the drain electrode may further include disposing a second photo mask.

In an embodiment, the disposing of the first gate line further includes disposing a second gate line overlapping the pixel electrode via the gate insulating layer and the passivation layer.

In an embodiment, the disposing of the first gate line further includes disposing a storage electrode overlapping the pixel electrode via the gate insulating layer and the passivation layer.

In an embodiment, the heating may be at a temperature between about 100° C. to about 250° C.

These and other features, aspects, and advantages of the disclosed embodiments will become better understood with reference to the following description and appended claims.

BRIEF DESCRIPTION OF THE DRAWINGS

The above and other aspects, advantages, and features of the invention will become more apparent by describing in further detail exemplary embodiments thereof with reference to the attached drawings, in which.

Figure 1:
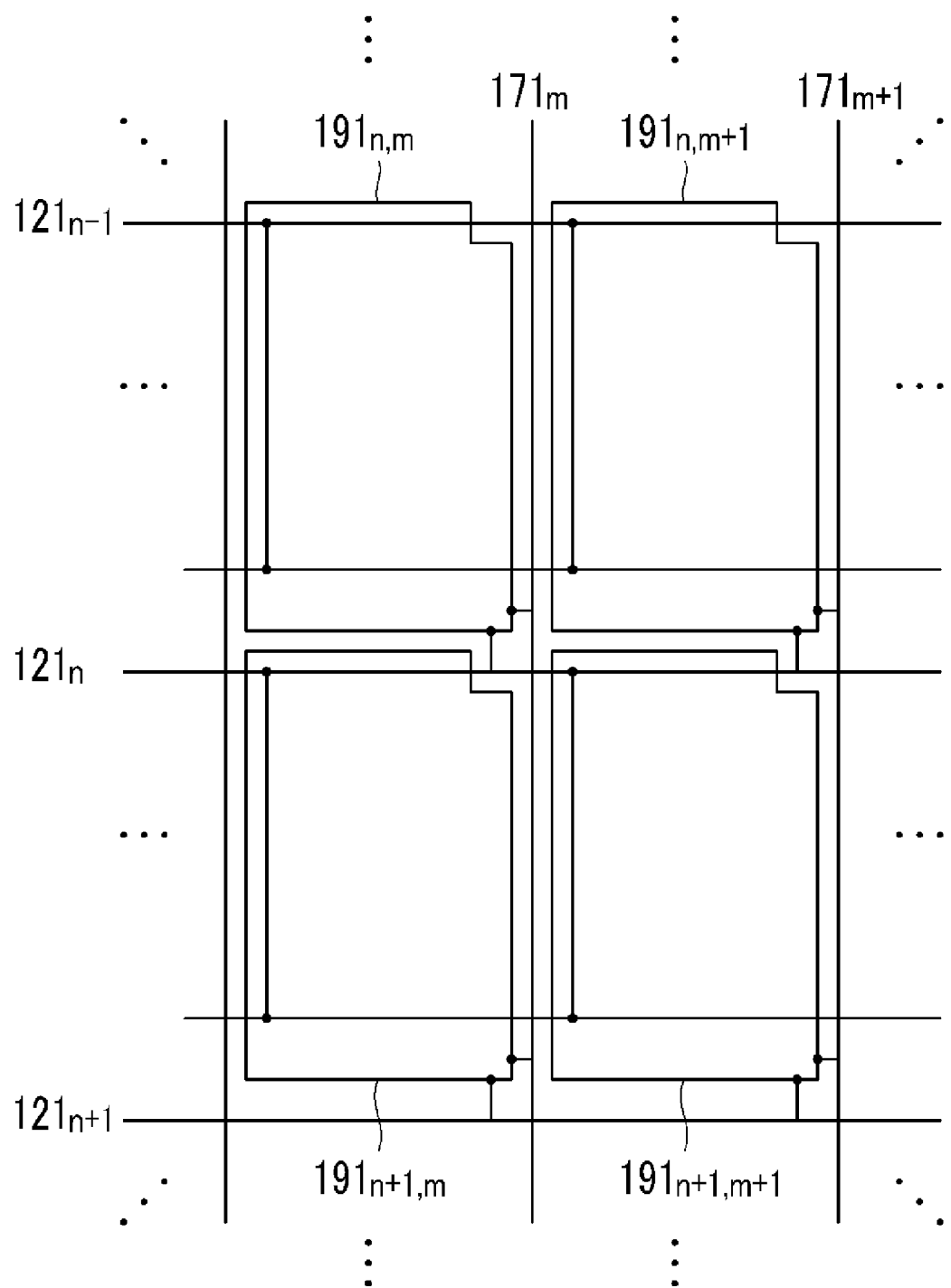
FIG. 1 is a plan view showing an exemplary embodiment of signal lines and pixel electrodes in a thin film transistor array panel.

The detailed description explains the disclosed embodiments, together with advantages and features, by way of example with reference to the drawings.

DETAILED DESCRIPTION OF THE INVENTION

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention. Thus aspects, advantages, and features of the present invention and methods of accomplishing the same may be understood more readily by reference to the following detailed description of preferred embodiments and the accompanying drawings. The present invention may, however, may be embodied in many different forms, and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of the present invention.

Spatially relative terms, such as "below", "lower", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "lower" relative to other elements or features would then be oriented "above" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the present invention will be described in detail with reference to the accompanying drawings. However, the aspects, features, and advantages of the present invention are not restricted to the ones set forth herein. The above and other aspects, features, and advantages of the present invention will become more apparent to one of ordinary skill in the art to which the present invention pertains by referencing a detailed description of the present invention given below.

A thin film transistor array panel according to an exemplary embodiment is described in detail with reference to FIG. 1.

FIG. 1 is a plan view showing an exemplary embodiment of signal lines and pixel electrodes in a thin film transistor array panel.

Referring to FIG. 1, a thin film transistor array panel according to an exemplary embodiment includes a plurality of gate lines $121_i$ (i=1, n−1, n, n+1, etc.), a plurality of data lines $171_j$ (j=1, m, m+1, etc.), and a plurality of pixel electrodes ($191_{i,j}$) (i=1, n, n+1, etc.) (j=1, m, m+1, etc.) electrically connected thereto and substantially arranged in a matrix.

The gate lines $121_i$ (i=1, n−1, n, n+1, etc.) extend substantially in a row direction and include a plurality of longitudinal lines and transverse lines connected to the longitudinal lines at lower portions of the longitudinal lines, the transverse lines extending in the row direction. The gate lines $121_i$ (i=1, n−1, n, n+1, etc.) transmit a gate signal comprising a combination of a gate-on voltage ("Von") for turning on a switching element (not shown) and a gate-off voltage ("Voff") for turning off the switching element.

The data lines $171_j$ (j=1, m, m+1, etc.) transmit a data signal and extend substantially in a column direction.

The pixel electrode ($191_{i,j}$) (i=1, n, n+1, etc.) (j=1, m, m+1, etc.) of the $i^{th}$ row and $j^{th}$ column is electrically connected to the $i^{th}$ (i=1, n−1, n, n+1, etc.) gate line $121_i$ and the $j^{th}$ (j=1, m, m+1, etc.) data line $171_j$ through a respective switching element (not shown).

The gate-on voltage Von is sequentially applied to the gate lines $121_i$ (i=1, n−1, n, n+1, etc.) to sequentially turn on switching elements (not shown), which are electrically connected to the gate lines $121_i$ (i=1, n−1, n, n+1, etc.) such that data voltages applied to the data lines $171_j$ (j=1, m, m+1, etc.) are transmitted to the pixel electrodes ($191_{i,j}$) (i=1, n, n+1, etc.) (j=1, m, m+1, etc.) through the switching elements (not shown), which are turned on.

Each pixel electrode ($191_{i,j}$) (i=1, n, n+1, etc.) (j=1, m, m+1, etc.) may maintain the applied data voltage by overlapping the previous gate line ($121_{i-1}$, i=2, n, n+1, etc.) via an insulating layer. For example, the pixel electrode $191_{n,j}$ (j=1, m, m+1, etc.) disposed in the $n^{th}$ row overlaps the previous gate line, which is the $(n-1)^{th}$ gate line $121_{n-1}$.

A thin film transistor array panel according to an exemplary embodiment will be described in detail with reference to FIG. 2 to FIG. 3B.

Figure 2:
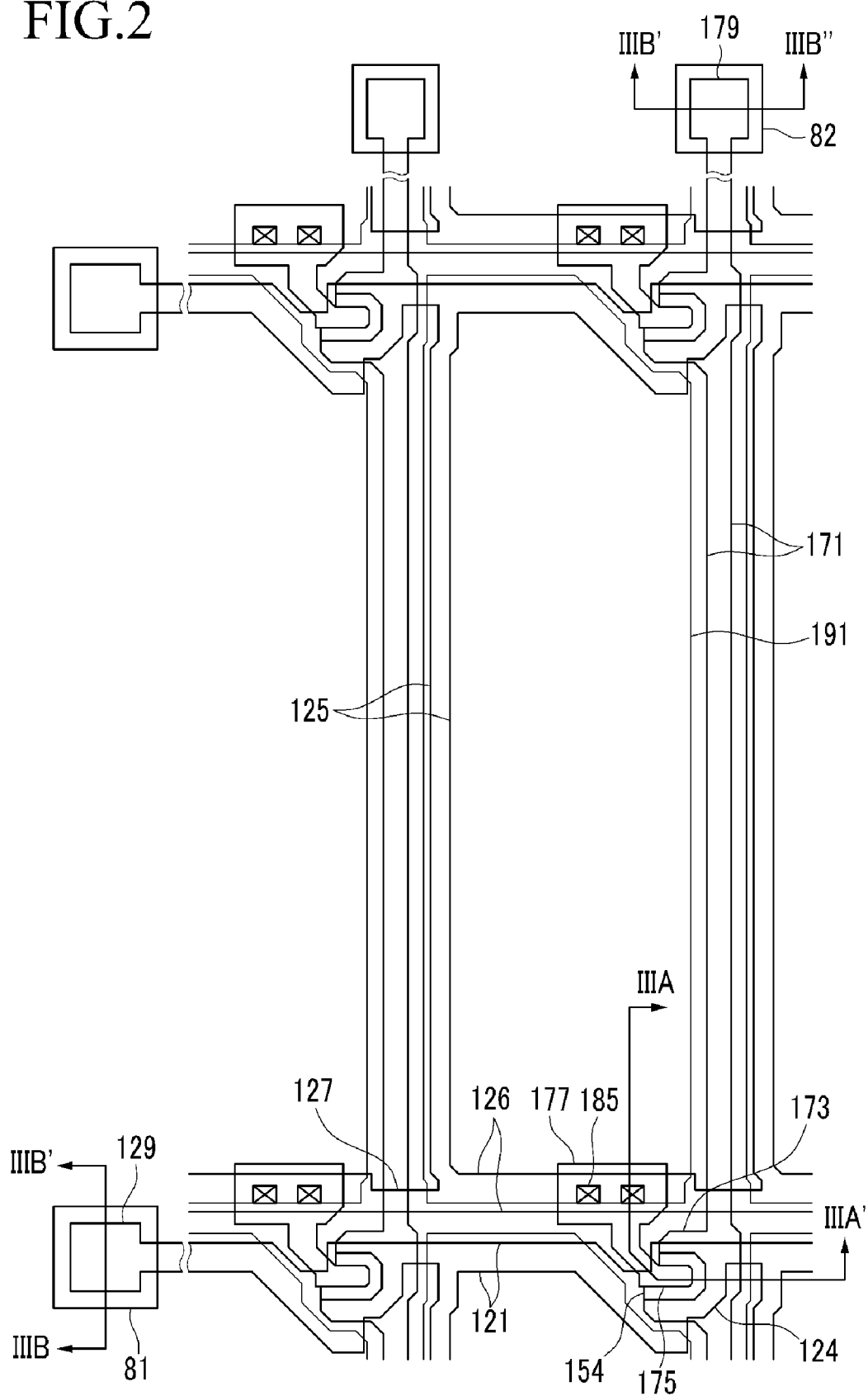
FIG. 2 is a plan view showing an exemplary embodiment of a thin film transistor array panel.
Figure 3A:
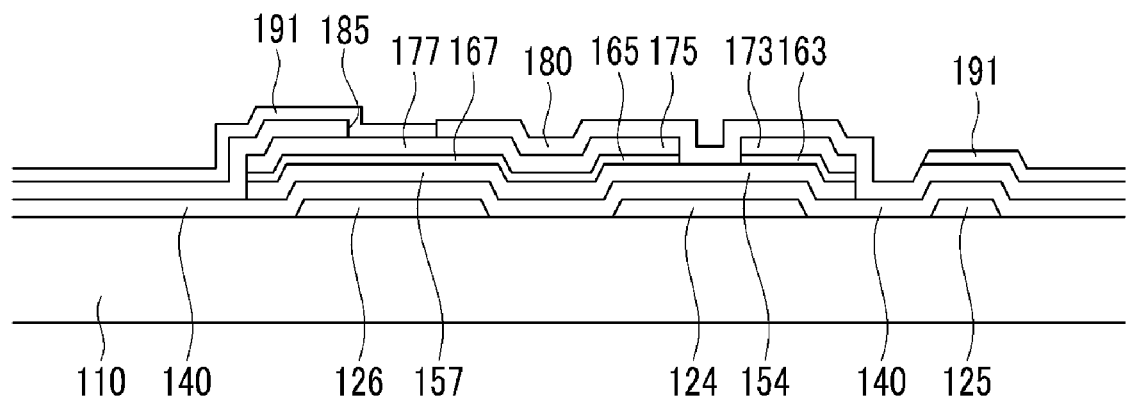
FIG. 3A is a cross-sectional view showing an exemplary embodiment of the thin film transistor array panel shown in FIG. 2 taken along line IIIA-IIIA'.
Figure 3B:
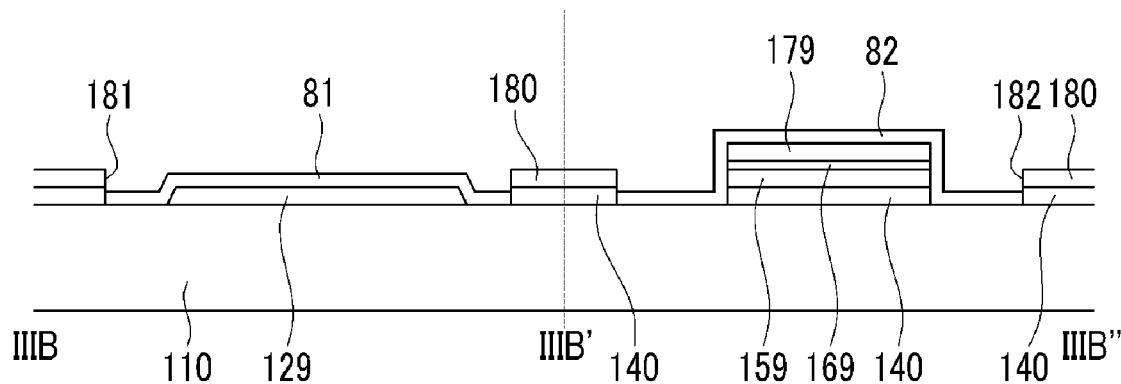
FIG. 3B is a cross-sectional view showing an exemplary embodiment of the thin film transistor array panel shown in FIG. 1 taken along lines IIIB-IIIB' and IIIB'-IIIB"

FIG. 2 is a plan view showing an exemplary embodiment of a thin film transistor array panel, FIG. 3A is a cross-sectional view showing an exemplary embodiment of the thin film transistor array panel shown in FIG. 2 taken along line IIIA-IIIA', and FIG. 3B is a cross-sectional view showing an exemplary embodiment of the thin film transistor array panel shown in FIG. 1 taken along lines IIIB-IIIB' and IIIB'-IIIB".

A plurality of gate lines 121 are disposed on an insulating substrate 110 and may comprise transparent glass, transparent plastic, or the like, or a combination comprising at least one of the foregoing materials. Each gate line 121 transmits a gate signal and extends in the row direction, and includes a plurality of gate electrodes 124 extending in a downward direction, and a gate line end portion 129 for electrical connection with another layer or a gate driver (not shown). Also, each gate line 121 includes a plurality of longitudinal portions 125 and a transverse portion 126 connected to lower portions of the longitudinal portions 125, the transverse portions extending in a row direction.

The gate lines 121 may comprise a metal having a low resistance, such as an aluminum-based metal. The gate lines 121 may comprise aluminum (Al), an aluminum alloy, a silver-based metal, silver (Ag), a silver alloy, a copper-based metal of copper (Cu), a copper alloy, or the like, or a combination comprising at least one of the foregoing metals.

A gate insulating layer 140 may comprise silicon nitride ($SiN_x$), silicon oxide ($SiO_x$), or the like, or a combination comprising at least one of the foregoing materials, and can be disposed on the gate lines 121.

A plurality of semiconductor stripes (not shown) may comprise hydrogenated amorphous silicon ("a—Si"), a polysilicon, or the like, or a combination comprising at least one of the foregoing materials, and are disposed on the gate insulating layer 140. The semiconductor stripes (not shown) extend substantially in a longitudinal direction, and the semiconductor stripes (not shown) include a plurality of semiconductor stripe protrusions 154 extending therefrom toward the gate electrodes 124, and an end portion of the semiconductor stripes. Each of the semiconductor stripe protrusions 154 also includes a semiconductor quadrangle expansion 157.

A plurality of ohmic contact stripes (not shown) and ohmic contact islands 165 are disposed on the semiconductor stripe protrusions 154, semiconductor quadrangle expansions 157, and semiconductor end portion 159. Each of the ohmic contact stripes (not shown) includes a plurality of protrusions 163 extending according to the semiconductor stripe protrusions 154, and an ohmic contact end portion 169, wherein the ohmic contact stripe protrusions 163, and the ohmic contact islands 165 are disposed on the semiconductor stripe protrusions 154 opposing each other thereby forming a pair with respect to the gate electrode 124. Each of the ohmic contact stripe protrusions 163 includes an ohmic contact quadrangle expansion 167. The ohmic contact stripe protrusions 163, ohmic contact islands 165, ohmic contact quadrangle expansions 167, and ohmic contact end portion 169 may comprise n+hydrogenated amorphous silicon in which an n-type impurity, such as phosphorus, is doped at a high concentration, a silicide, or the like, or a combination comprising at least one of the foregoing materials.

A plurality of data lines 171 and a plurality of drain electrodes 175 are disposed on the ohmic contact stripes (not shown) including the ohmic contact stripe protrusions 163, ohmic contact islands 165, ohmic contact quadrangle expansions 167, and ohmic contact end portion 169.

The data lines 171 transmit data voltages, and extend in a longitudinal direction perpendicular to the gate lines 121. Each of the data lines 171 includes a plurality of source electrodes 173 curved toward the gate electrodes 124, and an end portion of the data line 179 for connecting to another layer or a data driver (not shown).

The drain electrodes 175 are disposed opposite to the source electrodes 173, and each includes a drain electrode quadrangle end portion 177 having a wide area and a bar-shaped end portion. The drain electrode quadrangle end portions 177 overlap the transverse portions 126 of the gate lines 121, and the bar-shaped end portions are each enclosed by a curved portion of each of the source electrodes 173.

A gate electrode 124, a source electrode 173, and a drain electrode 175 form a thin film transistor ("TFT") along with a semiconductor stripe protrusion 154, and the channel of the thin film transistor is disposed in the semiconductor stripe protrusion 154 between the source electrode 173 and the drain electrode 175.

The semiconductor stripe protrusions 154 include exposed portions between the source electrodes 173 and the drain electrodes 175 which are not covered by the ohmic contact stripes (not shown) including the ohmic contact stripe protrusions 163, the ohmic contact islands 165, the ohmic contact quadrangle expansions 167, the ohmic contact end portions 169, the data lines 171, and the drain electrodes 175. In an embodiment, the semiconductor stripe protrusions 154, the semiconductor quadrangle expansions 157, and the semiconductor end portions 159, except for the semiconductor stripe protrusions 154 where the thin film transistors are disposed, comprise a planar shape which is the same as a planar shape of the data lines 171, the drain electrodes 175, and the underlying ohmic contact stripe protrusions 163, ohmic contact islands 165, ohmic contact quadrangle expansions 167, and ohmic contact end portions 169. Also, the ohmic contact stripe protrusions 163, ohmic contact islands 165, ohmic contact quadrangle expansions 167, and ohmic contact end portions 169 have a planar shape which is substantially the same as a planar shape of the data lines 171 and the drain electrodes 175.

A passivation layer 180 is disposed on the gate insulating layer 140, the data lines 171, the drain electrodes 175, and exposed portions of the semiconductor stripe protrusions 154. The passivation layer 180 may comprise an inorganic insulator, such as silicon nitride or silicon oxide, an organic insulator, such as a resin, or the like, or a combination comprising at least one of the foregoing insulators, and may have a flat surface. The organic insulator may have a dielectric constant of equal to or less than 6, specifically equal to or less than 4, more specifically equal to or less than 3, and may be photosensitive.

The passivation layer 180 has a plurality of contact holes 185 exposing the drain electrode quadrangle end portions 177 of the drain electrodes 175, and the passivation layer 180 and the gate insulating layer 140 have a plurality of first and second openings 181 and 182 respectively exposing the gate line end portions 129 of the gate lines 121 and the date line end portions 179 the data lines 171. The first and second openings 181 and 182 may further expose the substrate 110 surrounding the gate line end portions 129 and data line end portions 179 of the gate lines 121 and the data lines 171, respectively.

A plurality of pixel electrodes 191 are disposed on the passivation layer 180, a plurality of first contact assistants 81 are disposed on the gate line end portions 129 of the gate lines 121 and the substrate 110 surrounding the gate line end portions 129 of the gate lines 121 in the first opening 181, and a plurality of second contact assistants 82 are is disposed on the data line end portions 179 of the data lines 171 and the substrate 110 surrounding the data line end portions 179 of the data lines 171 in the second opening 182. The planar shapes of the first and second contact assistants 81 and 82 are respectively the same as planar shapes of the first and second openings. The pixel electrodes 191 and the first and second contact assistants 81 and 82 may comprise a transparent conductive material, such as indium tin oxide ("ITO"), indium zinc oxide ("IZO"), or the like, or a reflective metal, such as aluminum, silver, chromium, an alloy thereof, or the like, or a combination comprising at least one of the foregoing materials.

The pixel electrodes 191 are physically and electrically connected to the drain electrodes 175 through the contact holes 185, and receive data voltages from the drain electrodes 175.

The first and second contact assistants 81 and 82 substantially cover the gate line end portions 129 of the gate lines 121 and the data line end portions 179 of the data lines 171 in the openings 181 and 182, and are electrically connected thereto. The first and second contact assistants 81 and 82 protect the gate line end portions 129 and the data line end portions 179, and facilitate adhesion of the gate line end portions 129 and data line end portions 179 to an external device.

The pixel electrodes 191 overlap the previous gate lines 121, including longitudinal portions 125 and the transverse portion 126, via the gate insulating layer 140 and the passivation layer 180 to form storage capacitors, and the storage capacitors maintain the data voltages applied to the pixel electrodes 191 even after the thin film transistors are turned off. Also, the drain electrode quadrangle end portions 177 of the drain electrodes 175 overlap the transverse portion 126 of the previous gate line 121 via the gate insulating layer 140, the semiconductor quadrangle expansion 157, and the ohmic contact quadrangle expansion 167 to form an additional storage capacitor. Alternatively, the pixel electrodes 191, or the drain electrodes 175, may overlap an additional storage electrode line (not shown) and transmit a common voltage ("Vcom") in place of the previous gate line 121 to form the storage capacitor.

The gate insulating layer 140 and a portion of the passivation layer 180 under the pixel electrodes 191 makes it easier to form a storage capacitor, and thus, an additional region for forming the storage capacitor is not required, thereby reducing or effectively preventing a decrease of the aperture ratio.

Also, the gate insulating layer 140 and the portion of the passivation layer 180 remaining under the pixel electrodes 191 contributes to reducing the step difference of the thin films, such as the pixel electrodes 191. Accordingly, when an alignment layer (not shown) is disposed on the pixel electrodes 191, incomplete rubbing around the steps may be reduced or substantially prevented, and when using ball spacers (not shown), a non-uniform cell gap generated by a height difference between the spacers disposed on high portions of the pixel electrodes 191 and the spacers disposed on low portions of the pixel electrodes 191 may be reduced or substantially eliminated. Also, display deterioration, such as light leakage which may be occur where a direction of the liquid crystal molecules (not shown) in the liquid crystal layer (not shown) disposed around steps of the pixel electrodes 191 is not regulated, may be reduced or substantially eliminated such that a reduction of the aperture ratio may be reduced or substantially prevented.

Next a manufacturing method of the thin film transistor array panel of FIG. 1 to FIG. 3B according to an exemplary embodiment is described with reference to FIG. 4A to FIG. 14B with FIG. 1 to FIG. 3B.

FIG. 4A, FIG. 5A, FIG. 6A, FIG. 7A, FIG. 8A, FIG. 9A, FIG. 10A, FIG. 11A, FIG. 12A, FIG. 13A, and FIG. 14A are cross-sectional views showing an exemplary embodiment of intermediate parts of a manufacturing process of the thin film transistor array panel shown in FIG. 2 according to an exemplary embodiment taken along line IIIA-IIIA', and FIG. 4B, FIG. 5B, FIG. 6B, FIG. 7B, FIG. 8B, FIG. 9B, FIG. 10B, FIG. 11B, FIG. 12B, FIG. 13B, and FIG. 14B are cross-sectional views showing intermediate parts of a manufacturing process of the thin film transistor array panel shown in FIG. 2 according to an exemplary embodiment taken along lines IIIB-IIIB' and IIIB'-IIIB".

Figure 4A:
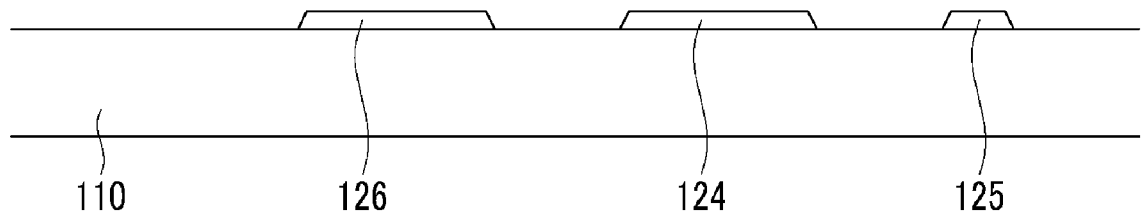
FIG. 4A, FIG. 5A, FIG. 6A, FIG. 7A, FIG. 8A, FIG. 9A, FIG. 10A, FIG. 11A, FIG. 12A, FIG. 13A, and FIG. 14A are cross-sectional views showing an exemplary embodiment of intermediate parts of a manufacturing process of the thin film transistor array panel shown in FIG. 2 taken along line IIIA-IIIA'.
Figure 4B:
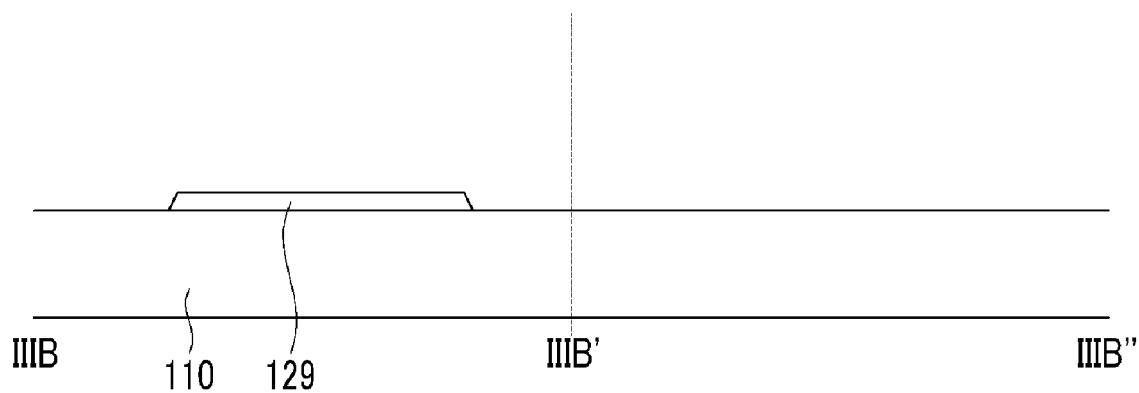
FIG. 4B, FIG. 5B, FIG. 6B, FIG. 7B, FIG. 8B, FIG. 9B, FIG. 10B, FIG. 11B, FIG. 12B, FIG. 13B and FIG. 14B are cross-sectional views showing an exemplary embodiment of intermediate parts of a manufacturing process of the thin film transistor array panel shown in FIG. 2 taken along lines IIIB-IIIB' and IIIB'-IIIB".

Referring to FIG. 4A and FIG. 4B, a metal having a low resistance, such as a metal comprising aluminum (Al), a metal comprising silver (Ag), a metal comprising copper (Cu), or the like, or a combination comprising at least one of the foregoing metals, is disposed on an insulating substrate 110, which may comprise transparent glass, transparent plastic, or the like, or a combination comprising at least one of the foregoing transparent materials, and patterned by photolithography to form a plurality of gate lines 121 each of which includes gate electrodes 124, longitudinal portions 125, a transverse portion 126, and a gate line end portion 129.

Figure 5A:
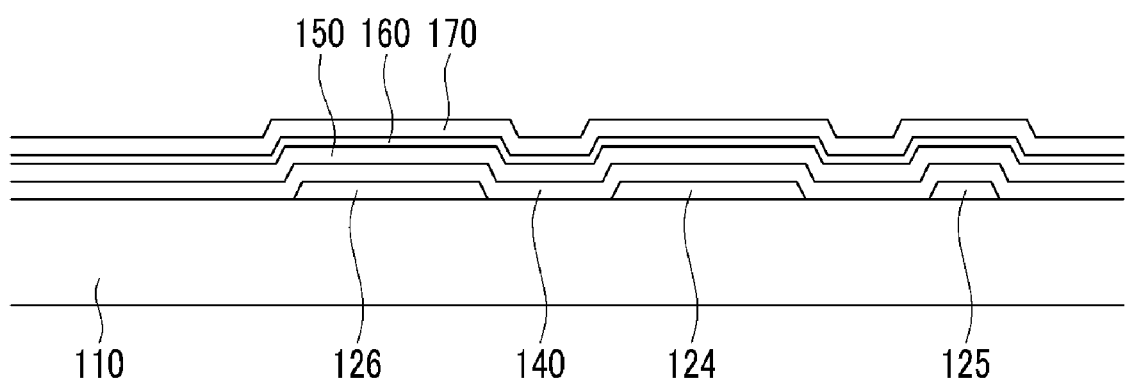
Figure 5B:
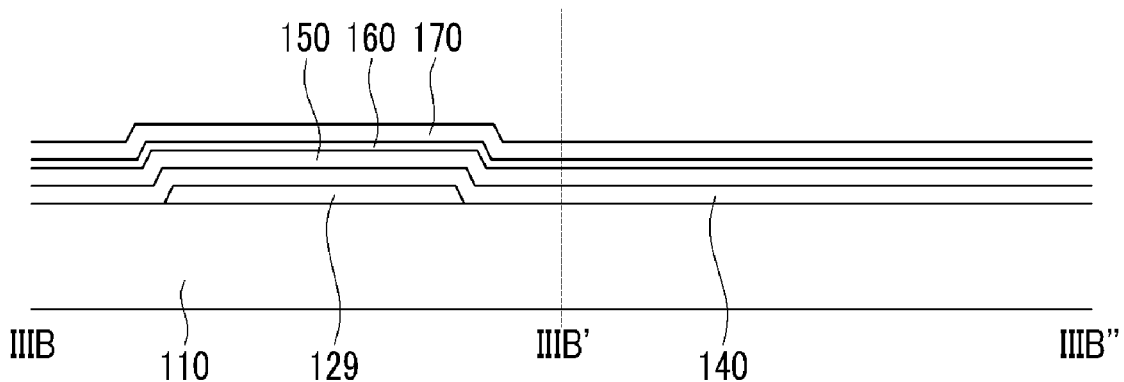

Referring to FIG. 5A and FIG. 5B, a gate insulating layer 140, which may comprise silicon nitride, silicon oxide, or the like, or a combination comprising at least one of the foregoing materials, an intrinsic semiconductor layer 150, which may comprise amorphous silicon, polysilicon, or the like, or a combination comprising at least one of the foregoing materials, an impurity-doped semiconductor layer 160, and a data conductive layer 170 are sequentially disposed on the substrate 110 and the gate lines 121.

Figure 6A:
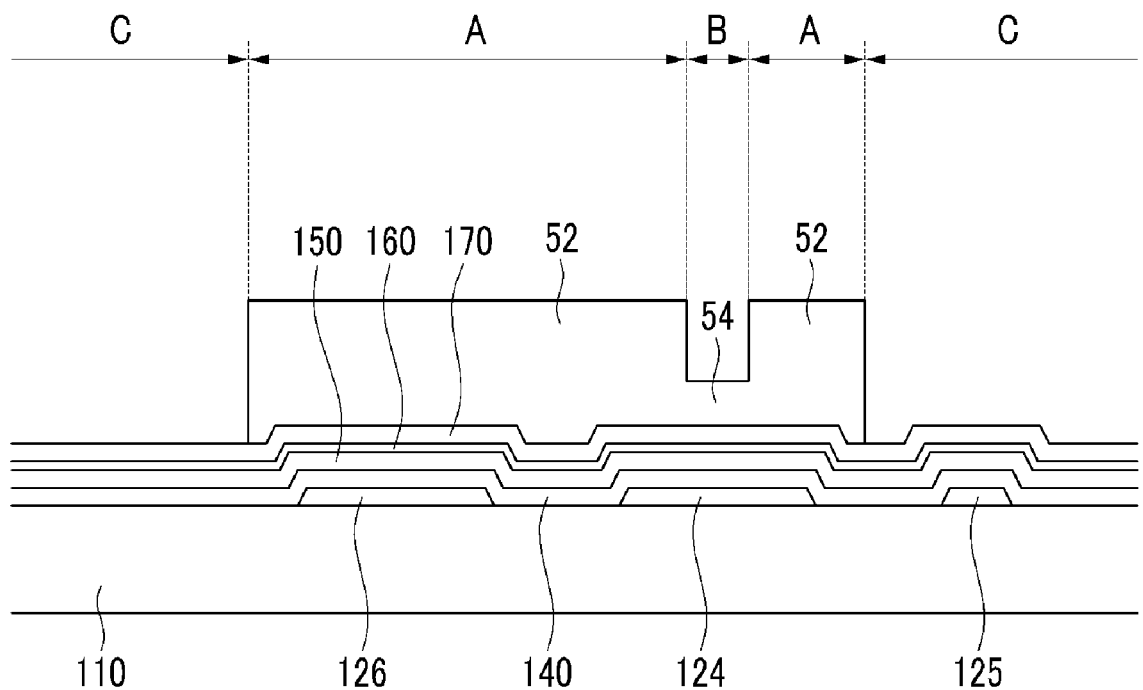
Figure 6B:
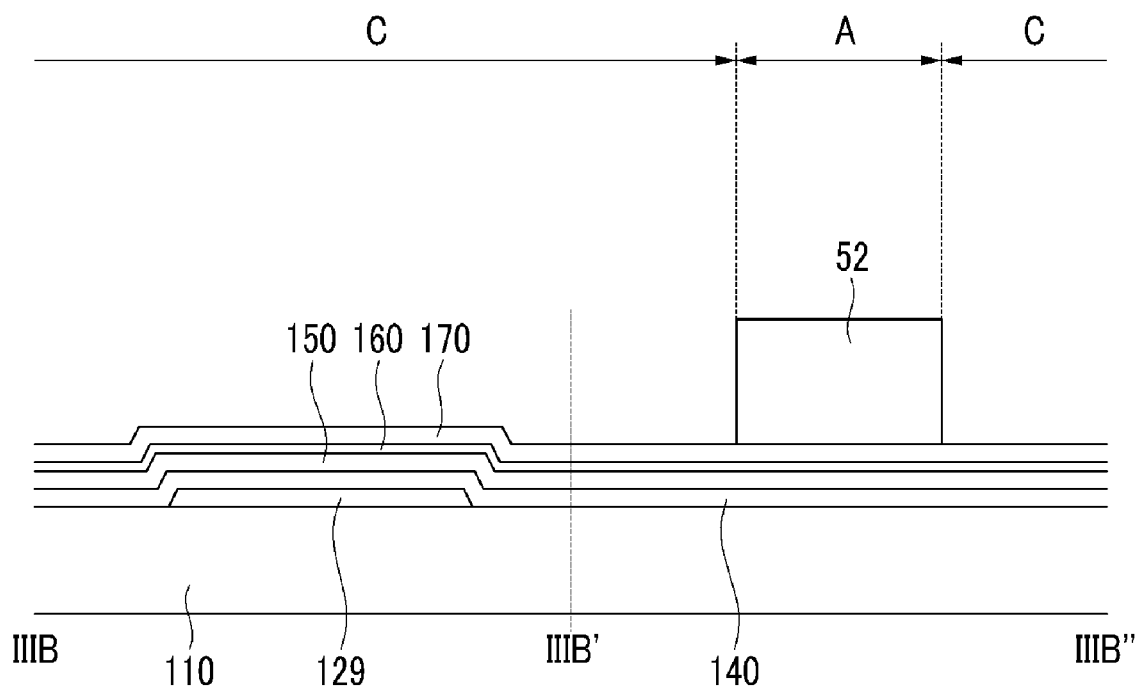

Next, referring to FIG. 6A and FIG. 6B, a photosensitive film (not shown) is disposed on the data conductive layer 170, exposed to light using a photo mask (not shown), and developed to form a photosensitive film pattern including a thick portion 52 and a thin portion 54.

In an embodiment, when the photosensitive film (not shown) has negative photosensitivity, thus portions exposed to light remain, the photo mask (not shown) in the A region is transparent such that light is transmitted, the photo mask (not shown) in the C region is opaque such that light is blocked, and the photo mask (not shown) in the B region is translucent such light is partially transmitted. The photosensitive film corresponding to the A region where light is transmitted forms the thick portion 52, the photosensitive film corresponding to the C region is completely removed, and the photosensitive film corresponding to the B region forms the thin portion 54. Alternatively, when the photosensitive film (not shown) has positive photosensitivity, thus the photosensitive film (not shown) exposed to light is removed, the transmittances of the A and C regions of the photo mask (not shown) are reversed and the B region is still translucent.

The photo mask (not shown) in the C region may include a pattern such as a slit, a lattice, or the like, or a combination comprising at least one of the foregoing patterns, or may be a translucent film to control the transmittance of light. The width of the slits or the intervals between lattice patterns may be less than the resolution of a light exposure used in the exposing process, and when a translucent film is used, thin films comprising an intermediate transmittance or an intermediate thickness may be used.

Figure 7A:
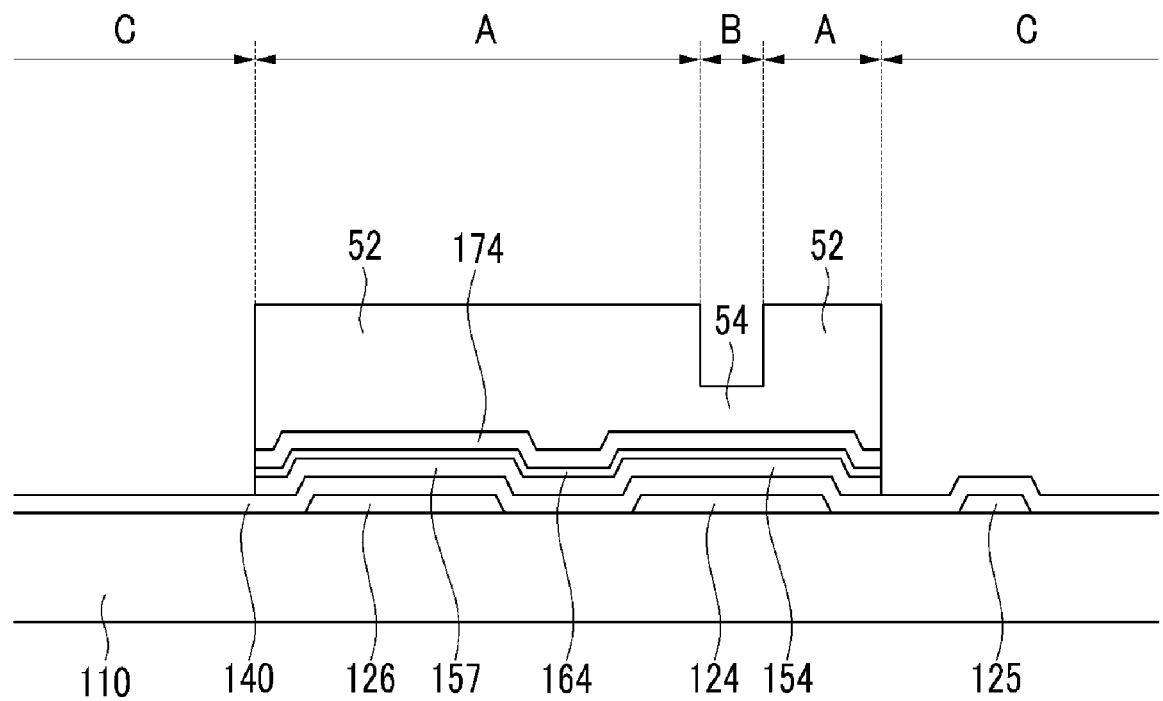
Figure 7B:
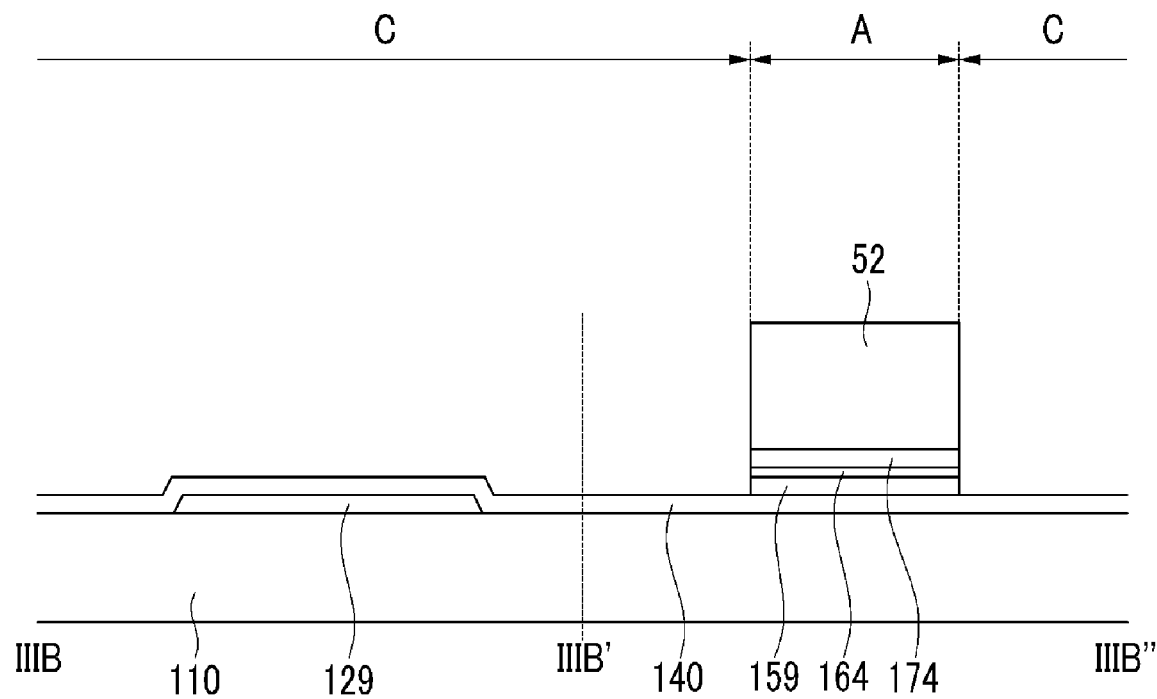

Next, referring to FIG. 7A and FIG. 7B, the data conductive layer 170, the impurity-doped semiconductor layer 160, and the intrinsic semiconductor layer 150, which are disposed in the C region, are removed by a wet or a dry etching process using the thick and thin photosensitive film patterns 52 and 54, respectively as an etching mask to form a plurality of data conductor layers 174, a plurality of ohmic contact layers 164, and a plurality of semiconductor stripes (not shown) including semiconductor stripe protrusions 154 and a semiconductor end portions 159, each comprising substantially the same planar shape.

Figure 8A:
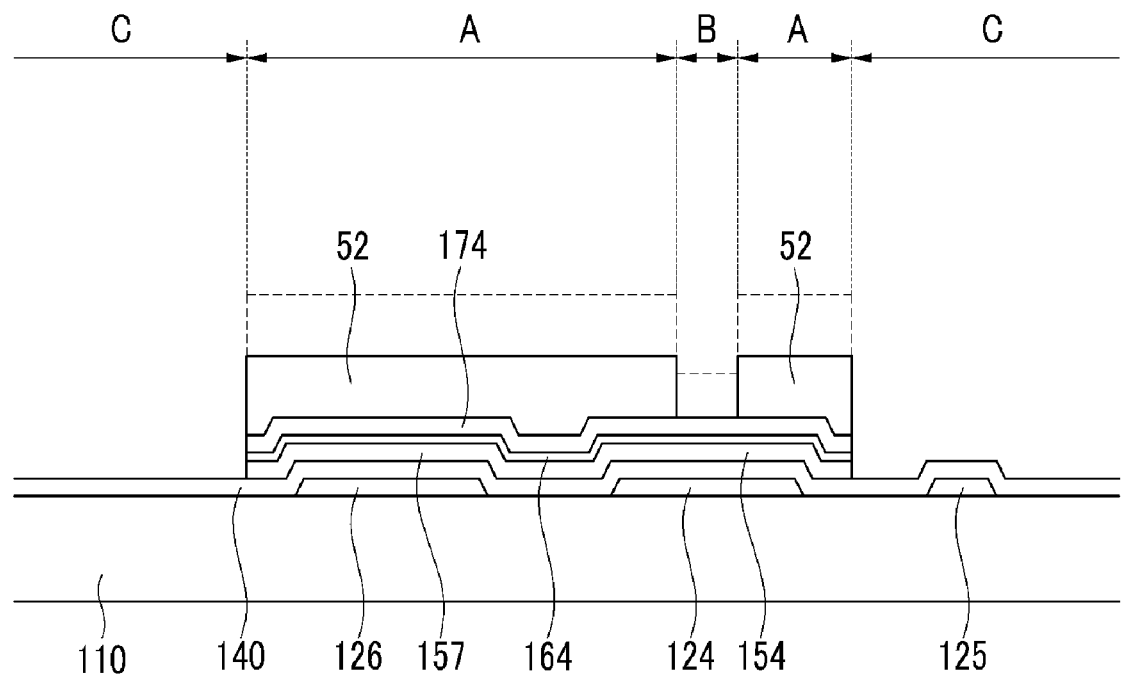
Figure 8B:
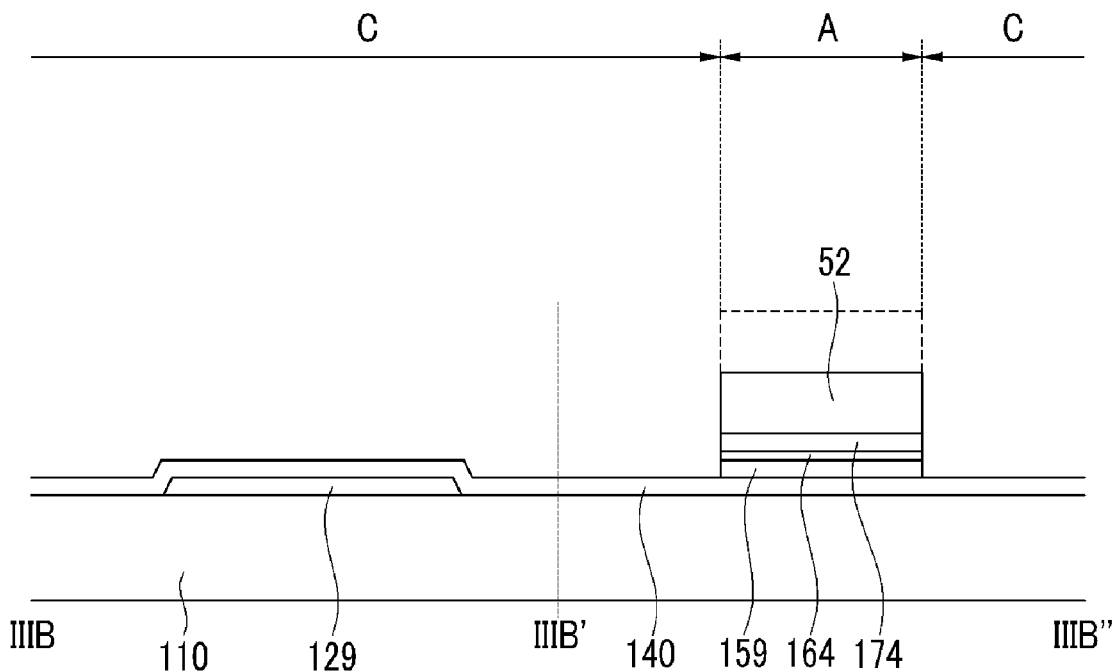

Next, referring to FIG. 8A and FIG. 8B, the thick and thin photosensitive film patterns 52 and 54 are ashed using an oxidation plasma to reduce a thickness such that the thin photosensitive film pattern 54 of the photosensitive film pattern disposed in the B region is removed. In an embodiment, the thickness of the thick photosensitive film pattern 52 is also reduced by approximately the thickness of the thin photosensitive film pattern 54.

Figure 9A:
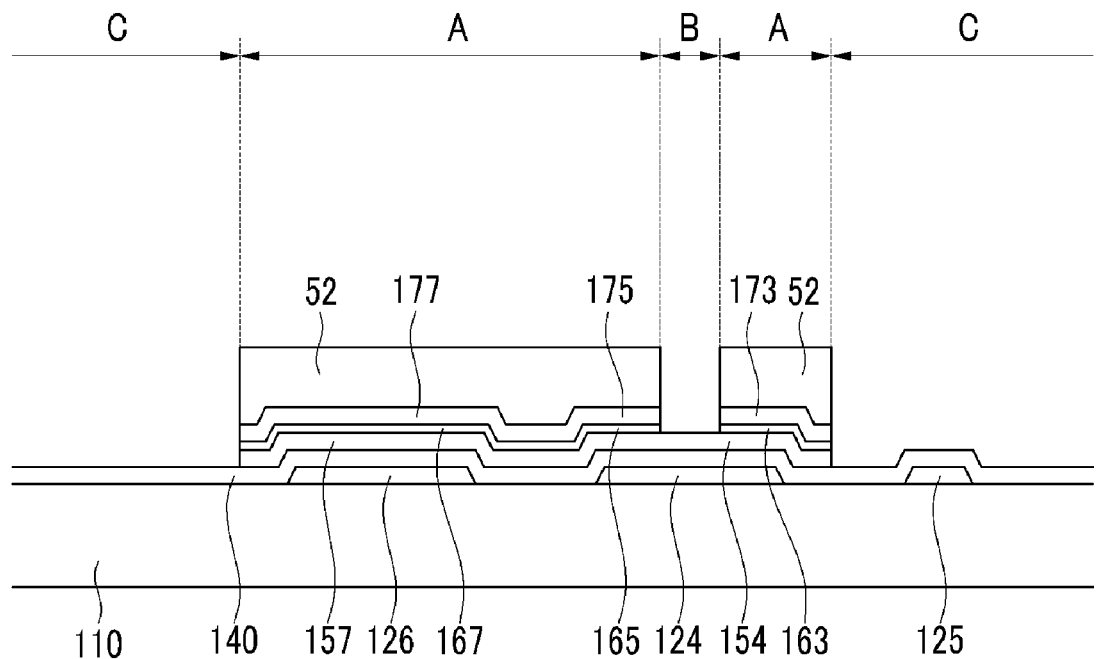
Figure 9B:
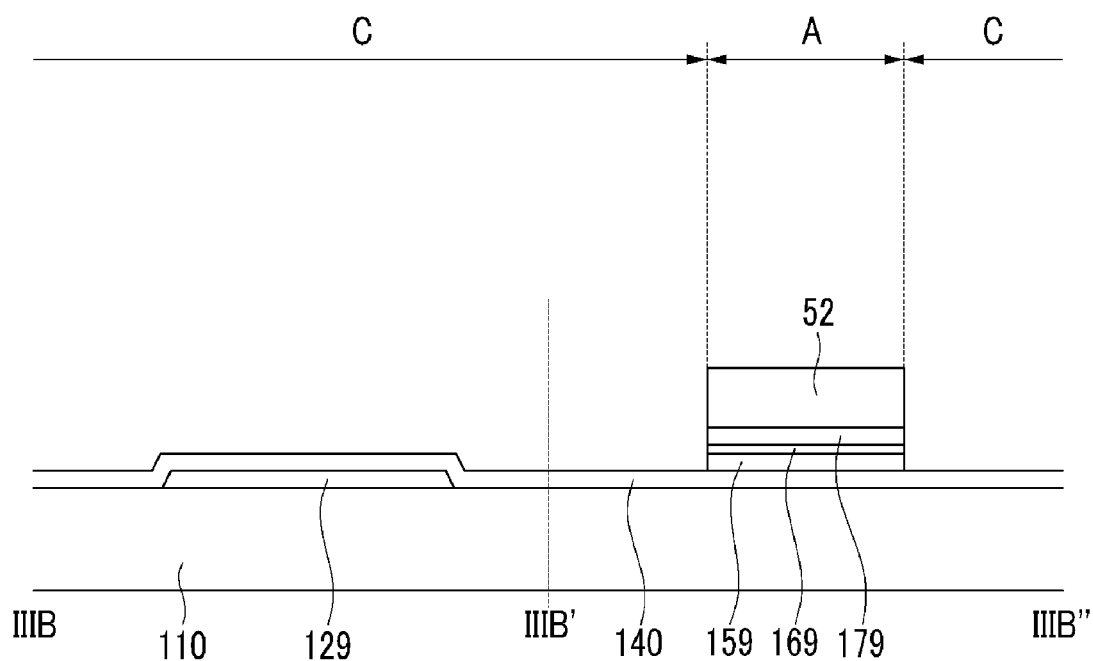

Next, as shown in FIG. 9A and FIG. 9B, the data conductor layer 174 and the portion of the ohmic contact layer 164 corresponding to the B region are removed using the remaining portion of the thick photosensitive film pattern 52 to dispose a plurality of data lines 171 including source electrodes 173 and a data line end portions 179, a plurality of drain electrodes 175, including drain electrode quadrangle end portions 177, a plurality of ohmic contact stripes (not shown) including ohmic contact stripe protrusions 163 and an ohmic contact end portions 169, and a plurality of ohmic contact islands 165, including ohmic contact quadrangle end portions 167. In an embodiment, the data conductor layer 174 may be wet-etched, and the ohmic contact layer 164 may be dry-etched.

Figure 10A:
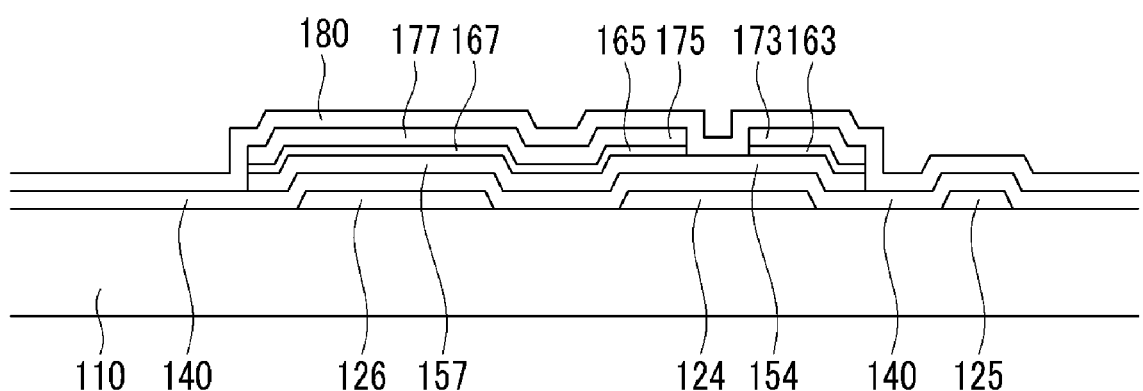
Figure 10B:
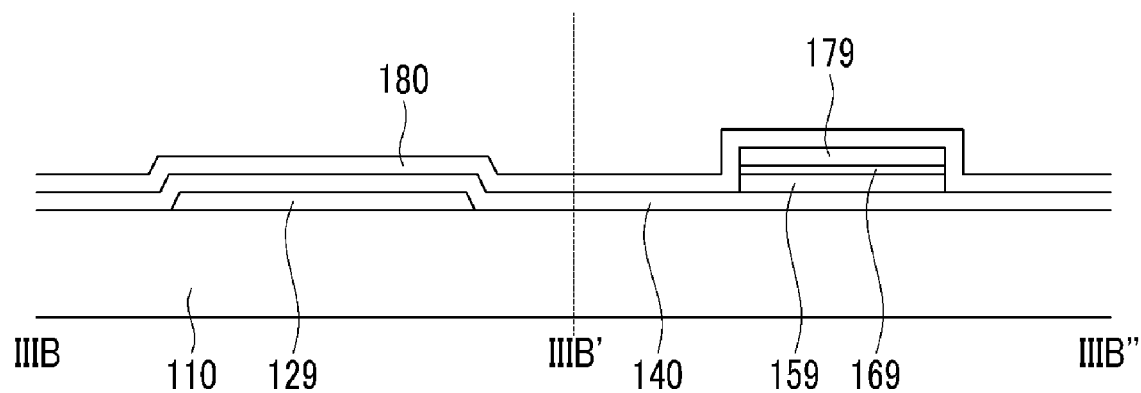

Next, referring to FIG. 10A and FIG. 10B, the remaining portion of the thick photosensitive film pattern 52 is removed, and an inorganic material or an organic material is disposed to form a passivation layer 180.

Figure 11A:
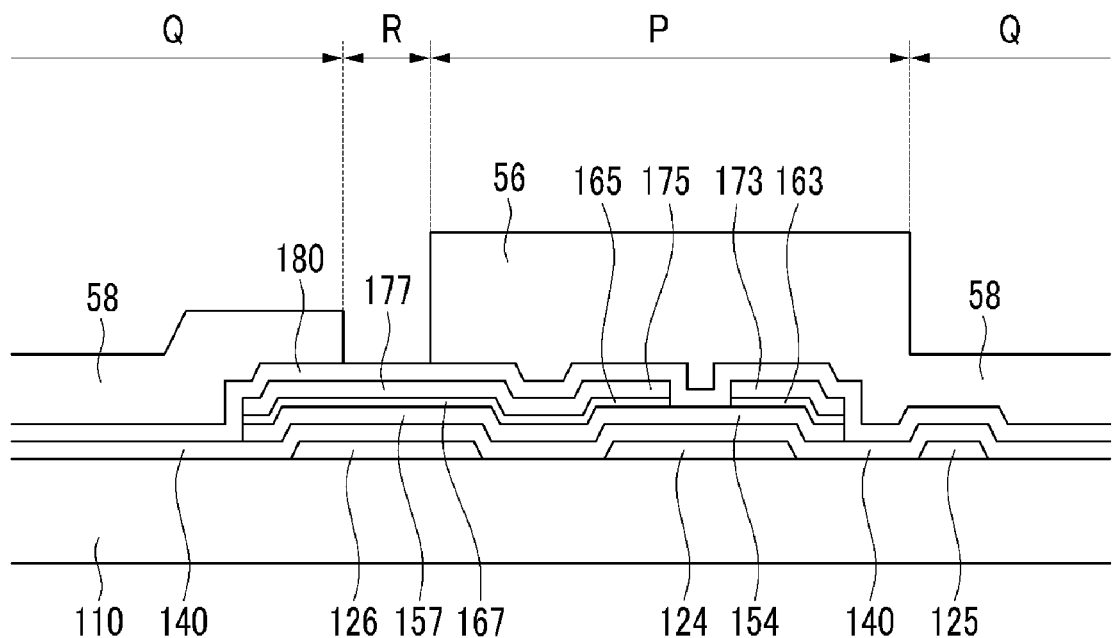
Figure 11B:
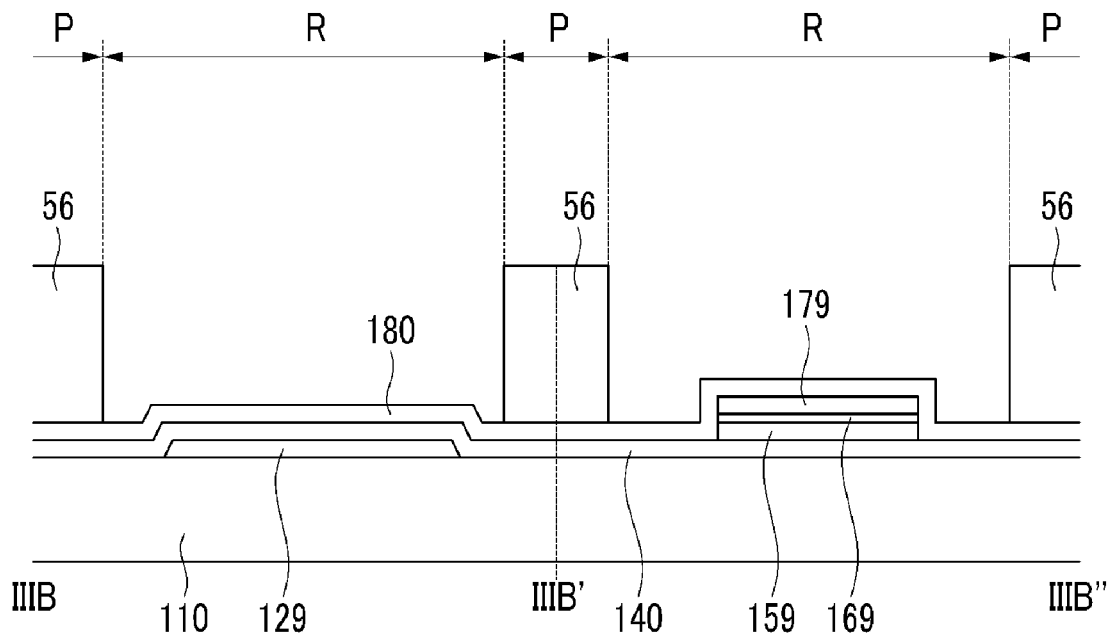

Next, referring to FIG. 11A and FIG. 11B, a photosensitive film (not shown) is disposed on the passivation layer 180, and is exposed to light using a photo mask (not shown) and developed to form a photosensitive film pattern including a thick portion 56 and a thin portion 58.

When the photosensitive film (not shown) has negative photosensitivity, thus portions exposed to light remain, the photo mask (not shown) in the P region is transparent such that light is transmitted, the photo mask (not shown) in the R region is opaque such that light is blocked, and the photo mask (not shown) in the Q region is translucent such that light is partially transmitted. The photosensitive film corresponding to the P region, where light is transmitted, forms the thick portion 56, the photosensitive film corresponding to the R region is completely removed, and the photosensitive film corresponding to the Q region forms the thin portion 58. Alternatively, when the photosensitive film (not shown) has positive photosensitivity, thus portions of the photosensitive film (not shown) exposed to light are removed, a relative transmittance of the P and R regions of the photo mask (not shown) are reversed and the Q region is still translucent.

Figure 12A:
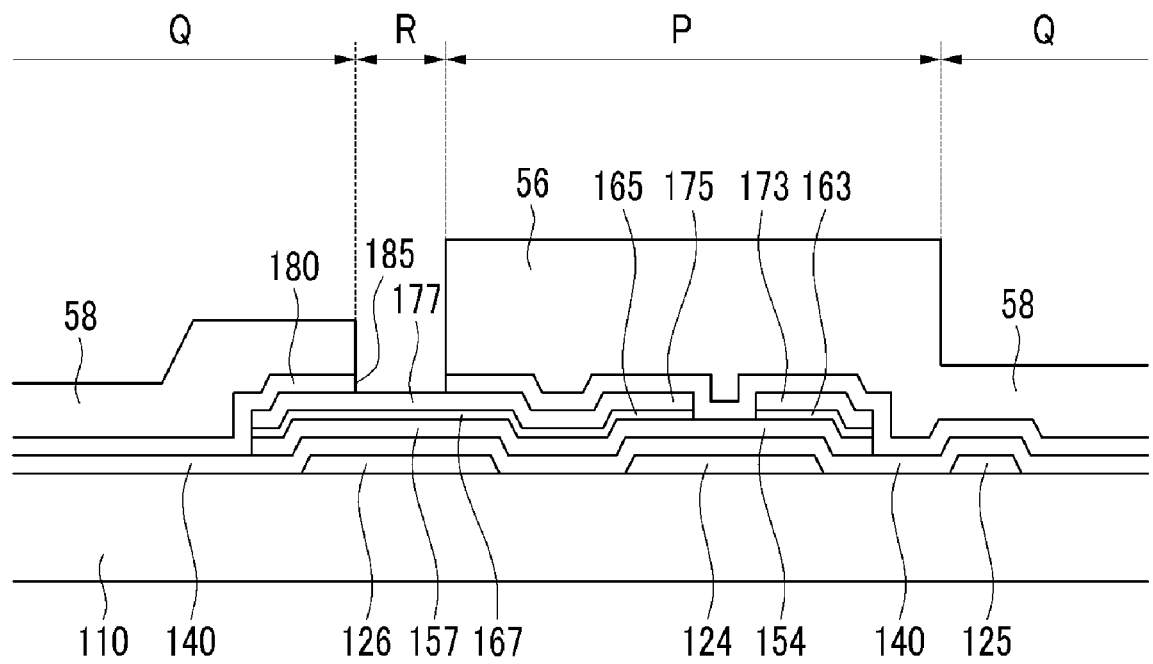
Figure 12B:
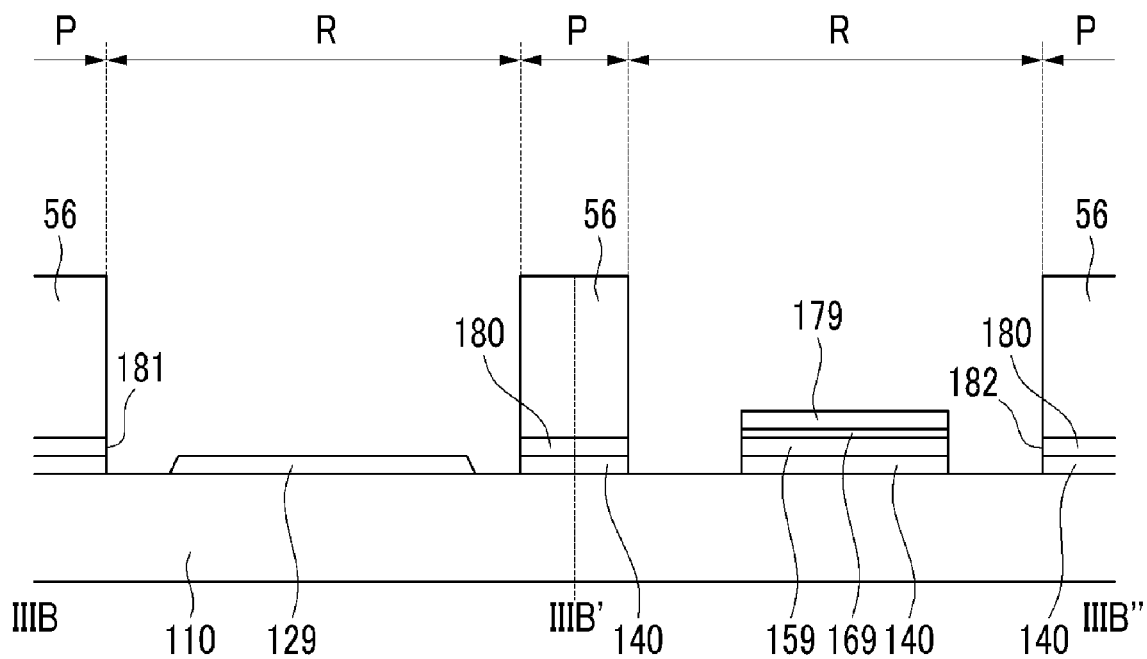

Next, as shown in FIG. 12A and FIG. 12B, the passivation layer 180 and the gate insulating layer 140, which are disposed in the R region, are removed by a method such as dry etching, or the like, using the thick portion 56 and the thin portion 58 as an etching mask. In an embodiment, contact holes 185 exposing the drain electrode quadrangle end portions 177 of the drain electrodes 175 and first and second openings 181 and 182 exposing the gate line end portions 129 and the data line end portions 179 of the gate lines 121 and data lines 171, and the substrate 110 surrounding the gate line end portions 129 and the data line end portions 179 are disposed. In an embodiment, an under-cut structure may be formed under the thick portion 56 and the thin portion 58 in the contact holes 185.

Figure 13A:
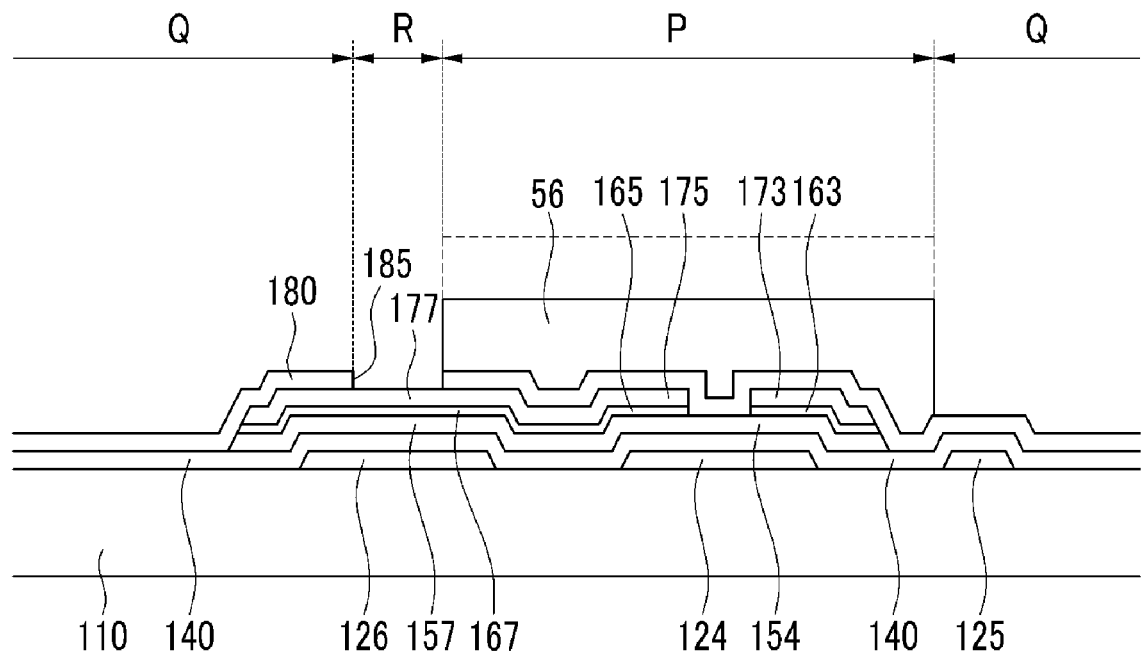
Figure 13B:
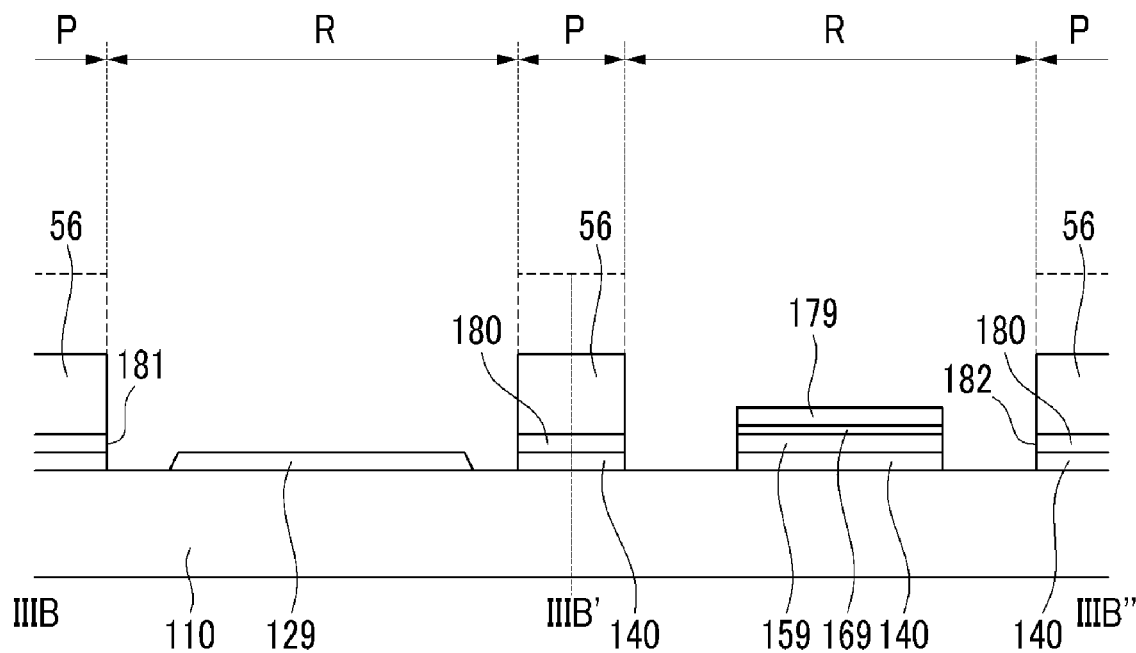

Next, referring to FIG. 13A and FIG. 13B, the thick portion 56 and the thin portion 58 are substantially entirely etched to reduce a thickness thereof such that the thin portion 58 of the photosensitive film pattern disposed in the Q region is removed. Here, a thickness of the thick portion 56 is also reduced by a thickness of the thin portion 58.

Figure 14A:
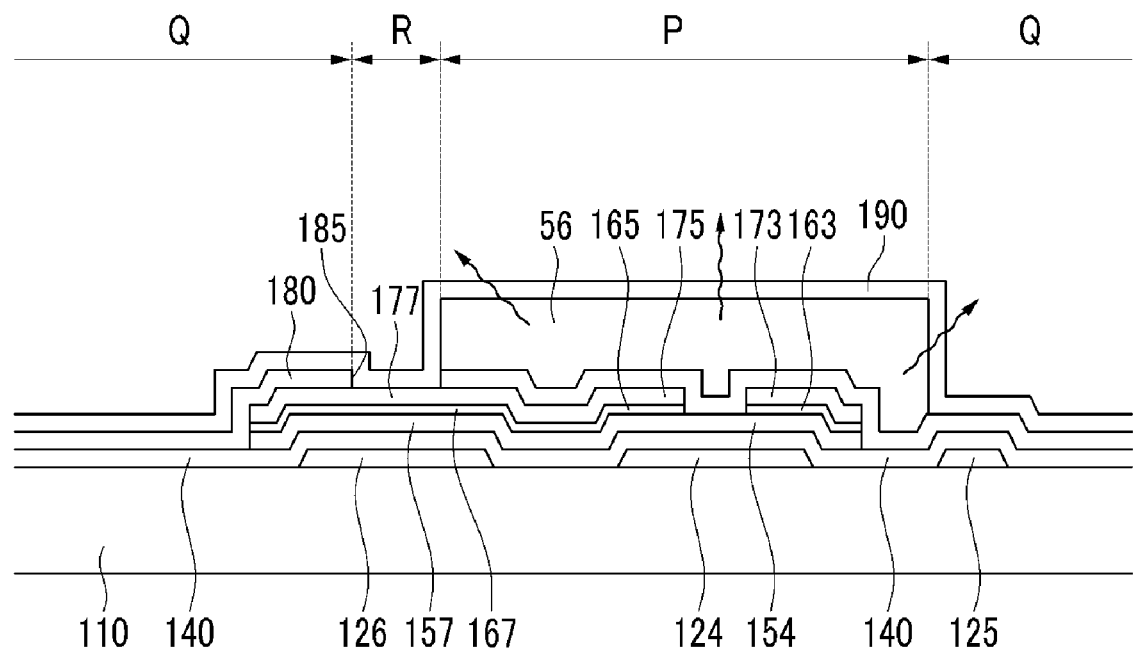
Figure 14B:
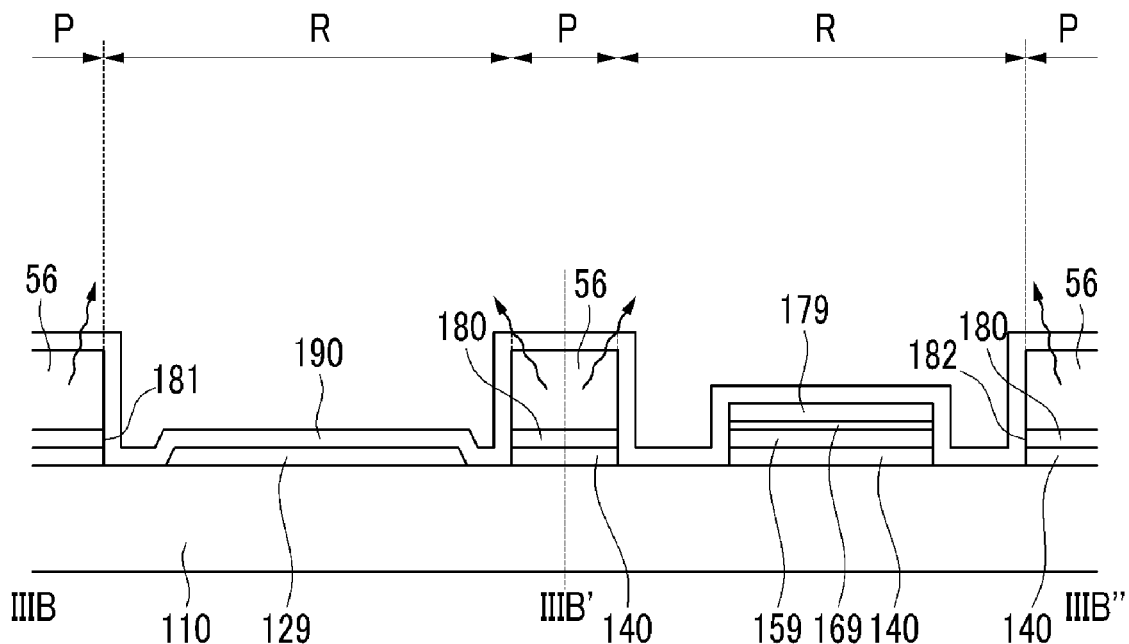

Next, as shown in FIG. 14A and FIG. 14B, a conductive layer 190, comprising a transparent conductive material, such as ITO, IZO, or the like, or a reflective metal, or a combination comprising at least one of the foregoing materials, is disposed and heated. In an embodiment, the heating temperature may be between about 100° C. to about 250° C., specifically between about 140° C. to about 220° C., more specifically between about 150° C. to about 210° C. In an embodiment, various gases such as oxygen gas ($O_2$) are extracted from the remaining portion of the thick portion 56 such that the conductive layer 190 disposed in the P region, specifically the conductive layer 190 disposed on the remaining portion of the thick portion 56, is cracked and is lifted up. The lifting off of the thick portion 56 is facilitated by the cracks in the conductive layer 190, and accordingly, the conductive layer 190 disposed on the thick portion 56 is removed together. As a result, as shown in FIG. 3A and FIG. 3B, pixel electrodes 191 and first and second contact assistants 81 and 82 are completed. Thus, in an embodiment, since the thick portion 56 is removed using cracks that are generated in the conductive layer 190 through a heating process, it is not necessary to form a big step difference in the conductive layer 190 or to remove the gate insulating layer 140 and the passivation layer 180 under the conductive layer 190. Also, disorder of the arrangement of the liquid crystal molecules around the steps may be reduced.

According to an exemplary embodiment, a thin film transistor array panel may be manufactured using three photolithographic processes, thereby reducing the manufacturing cost and time. Also, formation of a storage capacitor can be easier because the gate insulating layer 140 and the passivation layer 180 are left disposed between the pixel electrode 191 and the substrate 110, which results in an increased aperture ratio.

While this invention has been described in conjunction with exemplary embodiments, it is to be understood that the invention is not limited to the disclosed embodiments, but, on the contrary, includes various modifications and equivalent arrangements included within the spirit and scope of this disclosure and the appended claims.

What is claimed is:

1. A method for manufacturing a thin film transistor array panel comprising:
    disposing a first gate line comprising a gate electrode and an end portion on a substrate;
    disposing a gate insulating layer on the first gate line;
    disposing a semiconductor comprising a channel portion, a data line comprising a source electrode and an end portion, and a drain electrode on the gate insulating layer;
    disposing a passivation layer on the gate insulating layer, the data line, the drain electrode, and the channel portion of the semiconductor;
    disposing a photosensitive film on the passivation layer and exposing the photosensitive film to light using a first photo mask to form a first photosensitive film pattern, which comprises a first portion and a second portion, the second portion having a thickness which is greater than a thickness of the first portion, the first photosensitive film pattern exposing a portion of the passivation layer on a portion of the drain electrode;
    removing the exposed portion of the passivation layer using the first photosensitive film pattern as a mask;
    etching the first photosensitive film pattern to remove the first portion to form a second photosensitive film pattern;
    disposing a conductive layer on the second photosensitive film pattern;
    heating the second photosensitive film pattern to form cracks in the conductive layer; and
    forming a pixel electrode by removing the second photosensitive film pattern, the pixel electrode contacting a portion of the drain electrode and disposed on a portion of the passivation layer exposed by the removal of the first portion of the first photosensitive film pattern.

2. The method of claim 1,
    wherein the first photo mask comprises a first transparent region through which light is transmitted, a first opaque region where light is blocked, and a first translucent region which corresponds to the first portion and through which light is partially transmitted.

3. The method of claim 2,
wherein the first translucent region comprises at least one of a slit, a lattice pattern, and a translucent film.

4. The method of claim 1,
wherein the disposing of the semiconductor, the data line, and the drain electrode further comprises disposing a second photo mask.

5. The method of claim 4,
wherein the disposing of the semiconductor, the data line, and the drain electrode further comprises:
disposing sequentially an intrinsic semiconductor layer, an impurity-doped semiconductor layer, and a data conductive layer on the gate insulating layer;
disposing a photosensitive film on the data conductive layer and exposing the photosensitive film to light using the second photo mask to form a third photosensitive film pattern, which comprises a third portion corresponding to the channel portion of the semiconductor, and a fourth portion, the fourth portion comprising a thickness which is greater than a thickness of the third portion;
removing a portion of the data conductive layer, a portion of the impurity-doped semiconductor layer, and a portion of the semiconductor layer using the third photosensitive film pattern as a mask;
etching the third photosensitive film pattern to remove the third portion to form a fourth photosensitive film pattern; and
etching the data conductive layer and the impurity-doped semiconductor layer exposed by the removal of the third portion using the fourth photosensitive film pattern as a mask.

6. The method of claim 5,
wherein the second photo mask further comprises a second transparent region through which light is transmitted, a second opaque region where light is blocked, and a second translucent region through which light is partially transmitted.

7. The method of claim 1,
wherein the first photosensitive film pattern further exposes a portion of the passivation layer disposed on the end portion of the first gate line and a portion of the passivation layer disposed on the end portion of the data line, and
the forming of the pixel electrode further comprises disposing first and second contact assistants respectively contacting the end portion of the first gate line and the end portion of the data line.

8. The method of claim 7,
wherein the removing the portion of the passivation layer further comprises etching the gate insulating layer using the first photosensitive film pattern as a mask to expose the end portion of the first gate line.

9. The method of claim 8,
wherein the etching the gate insulating layer further comprises exposing the substrate surrounding the end portion of the first gate line and the substrate surrounding the end portion of the data line.

10. The method of claim 8,
wherein the disposing of the semiconductor, the data line, and the drain electrode further comprises disposing a second photo mask.

11. The method of claim 1,
wherein the disposing of the first gate line further comprises disposing a second gate line overlapping the pixel electrode via the gate insulating layer and the passivation layer.

12. The method of claim 1,
wherein the disposing of the first gate line further comprises disposing a storage electrode overlapping the pixel electrode via the gate insulating layer and the passivation layer.

13. The method of claim 1,
wherein the heating of the second photosensitive film pattern is performed at a temperature between about 100° C. to about 250° C.

* * * * *